United States Patent [19]

Hsue et al.

[11] Patent Number: 5,516,713
[45] Date of Patent: May 14, 1996

[54] METHOD OF MAKING HIGH COUPLING RATIO NAND TYPE FLASH MEMORY

[75] Inventors: Chen-Chiu Hsue; Ming-Tzong Yang, Both of Hsin-Chu, Taiwan

[73] Assignee: United Microelectronics Corporation, Hsinchu, Taiwan

[21] Appl. No.: 301,533

[22] Filed: Sep. 6, 1994

[51] Int. Cl.$^6$ ............................................ H01L 21/8247
[52] U.S. Cl. .................................. 437/43; 437/52
[58] Field of Search .......................... 437/43, 48, 52, 437/984; 257/321; 365/185.17

[56] References Cited

U.S. PATENT DOCUMENTS

| | | | |
|---|---|---|---|
| 4,945,068 | 7/1990 | Sugaya | 437/52 |
| 5,094,971 | 3/1992 | Kanebako | 437/52 |
| 5,273,923 | 12/1993 | Chang et al. | 437/43 |
| 5,284,786 | 2/1994 | Sethi | 437/43 |
| 5,352,619 | 10/1994 | Hong | 437/43 |
| 5,427,970 | 6/1995 | Hsue et al. | 437/43 |
| 5,480,819 | 1/1996 | Huang | 437/43 |

OTHER PUBLICATIONS

"A 4–MB Nand EEPROM with Tight Programmed $V_o$ Distribution" by M. Momodomi et al, IEEE Journal of Solid–State Circuits, vol. 26, No. 4. Apr. 1991, pp. 492–496.
"Technology Trend of Flash–EEPROM–Can Flash–EEPROM overcome DRAM?" Fukio Masuoka, 1992 Symposium on VLSI Technoloy Digest of Technical Papers, p. 6–9, 1992.
"A 1.13UM$^2$ Memory Cell Technology for Reliable 3.3V 64M Nand EEPROMS" by S.Aritome et al, Extended Abstracts of the 1993 International Conf. on Solid State Device & Materials, pp. 446–448, 1993.

*Primary Examiner*—George Fourson
*Assistant Examiner*—Richard A. Booth
*Attorney, Agent, or Firm*—George O. Saile; Rosemary L. S. Pike

[57] ABSTRACT

A new method of fabricating a high coupling ratio Flash EEPROM memory cell is described. A layer of silicon dioxide is grown over the surface of a semiconductor substrate. A layer of silicon nitride is deposited over the silicon dioxide layer and patterned. Silicon nitride spacers are formed on the sidewalls of the patterned silicon nitride layer. The silicon dioxide layer not covered by the patterned silicon nitride layer and the silicon nitride spacers is removed thereby exposing portions of the semiconductor substrate as tunneling windows. A tunnel oxide layer is grown on the exposed portions of the semiconductor substrate. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer which is patterned to form a control gate. Passivation and metallization complete the fabrication of the NAND type memory cell with improved coupling ratio.

18 Claims, 4 Drawing Sheets

METHOD OF MAKING HIGH COUPLING RATIO NAND TYPE FLASH MEMORY

BACKGROUND OF THE INVENTION

1. Field of the Invention

The invention relates to a method of fabricating semiconductor memory devices employing floating gates, and more particularly, to a method of fabricating NAND type memory devices employing floating gates having improved coupling ratio.

2. Description of the Prior Art

One class of semiconductor memory devices employ floating gates; that is, gates which are completely surrounded by an insulating layer, such as a silicon oxide. The presence or absence of charge in the floating gates represents binary information. These are called electrically programmable read only memories (EPROM). EEPROMs are erasable electrically programmable read only memories. "Flash" memory devices are those in which all of the cells can be erased in a single operation. As noted in the paper, "A 4-Mb NAND EEPROM with Tight Programmed $V_t$ Distribution," by M. Momodomi et al, *IEEE Journal of Solid-State Circuits*, Vol. 26, No. 4, April 1991, pp. 492–496, flash EEPROMs are NOR-structured cells in which memory cells are connected to a bit line in a parallel manner. A NAND-structured cell in which memory cells are arranged in series dramatically reduces the number of cell components as well as the cell size.

The two papers, "Technology Trend of Flash-EEPROM-Can Flash-EEPROM overcome DRAM?," by Fujio Masuoka, 1992 *Symposium on VLSI Technology Digest of Technical Papers*, pp. 6–9 and "A 1.13 um$^2$ Memory Cell Technology for Reliable 3.3 V 64M NAND EEPROMs," by S. Aritome et al, *Extended Abstracts of the* 1993 *International Conference on Solid State Devices and Materials*, pp. 446–448 discuss the future of NAND type EEPROMs. The coupling ratio of the NAND type EEPROM is limited, so the floating gate must overlap the field oxide area to improve the coupling ratio or the cell size must be increased or a higher program voltage used.

A number of workers in the art have described improved designs for NAND type EEPROMs. U.S. Pat. No. 5,094,971 to Kanebako teaches miniaturizing NAND type ROMs by self-aligned ion implantation. U.S. Pat. No. 5,273,923 to Chang et al teaches forming a tunneling window which overlaps both the active region and the field isolation region of the memory circuit. U.S. Pat. No. 4,945,068 to Sugaya teaches forming the thin tunnel oxide and the thick gate oxide in a single oxidation step using implanted nitrogen ions to slow the oxidation in the planned tunnel oxide region. U.S. Pat. No. 5,284,786 to Sethi teaches another method of forming a tunnel window.

SUMMARY OF THE INVENTION

A principal object of the present invention is to provide an effective and very manufacturable method of fabricating a NAND type flash EEPROM memory cell.

Another object of the present invention is to provide an effective and very manufacturable method of fabricating a high coupling ratio NAND type flash EEPROM memory cell.

In accordance with the objects of this invention a new method of fabricating a high coupling ratio Flash EEPROM memory cell is achieved. A layer of silicon dioxide is grown over the surface of a semiconductor substrate. A layer of silicon nitride is deposited over the silicon dioxide layer and patterned. Silicon nitride spacers are formed on the sidewalls of the patterned silicon nitride layer. The silicon dioxide layer not covered by the patterned silicon nitride layer and the silicon nitride spacers is removed thereby exposing portions of the semiconductor substrate as tunneling windows. A tunnel oxide layer is grown on the exposed portions of the semiconductor substrate. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer which is patterned to form a control gate. Passivation and metallization complete the fabrication of the NAND type memory cell with improved coupling ratio.

BRIEF DESCRIPTION OF THE DRAWINGS

In the accompanying drawings forming a material part of this description, there is shown.

DESCRIPTION OF THE PREFERRED EMBODIMENTS

Figure 1:
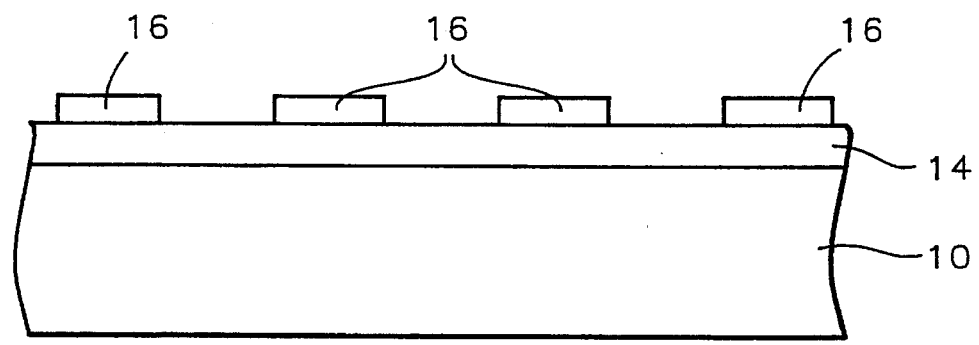
FIGS. 1–2, 6–7, and 10 schematically illustrate in cross-sectional representation a preferred embodiment of the present invention.

Referring now more particularly to FIG. 1, the process of the present invention will be described. A portion of a partially completed NAND type EEPROM is illustrated in FIG. 1 consisting of a semiconductor substrate 10, preferably composed of monocrystalline silicon.

A layer of silicon dioxide 14 is grown over the surfaces of the semiconductor substrate to a thickness of between about 200 to 400 Angstroms. A layer of silicon nitride 16 is deposited over the silicon dioxide layer to a thickness of between about 1000 to 2000 Angstroms and is patterned to provide openings to the underlying silicon dioxide layer 14.

Figure 2:
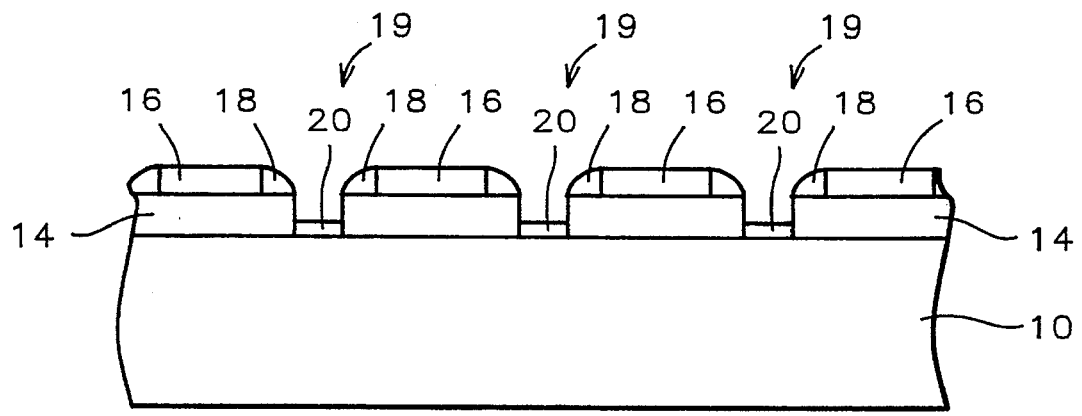

Referring now to FIG. 2, a second layer of silicon nitride is deposited over the surfaces of the substrate and anisotropically etched away leaving silicon nitride spacers 18 on the sidewalls of the patterned silicon nitride layer 16. The spacers are between about 500 to 3000 Angstroms in width. The portions of the silicon dioxide layer not covered by the silicon nitride layer 16 and spacers 18 are removed, exposing portions of the silicon substrate as tunneling windows.

Figure 3:
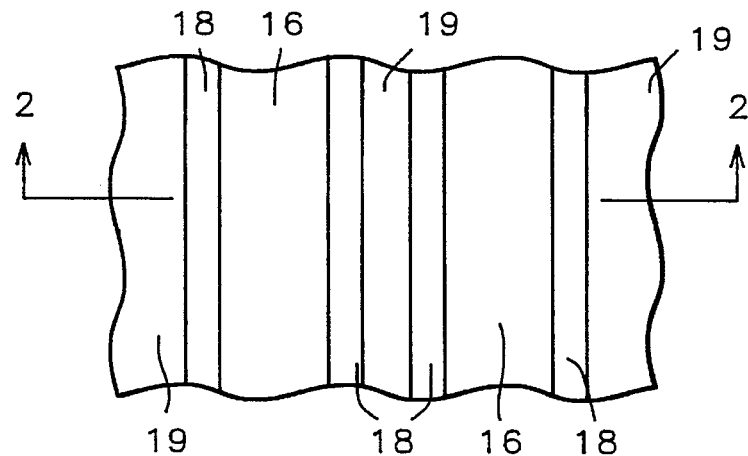
FIGS. 3 and 8 schematically illustrate in top plan view one preferred embodiment of the present invention.
Figure 4:
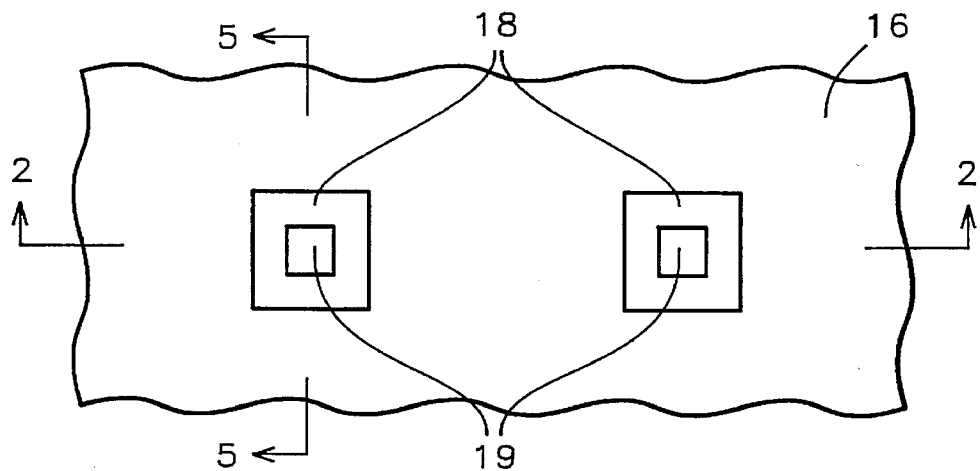
FIGS. 4 and 9 schematically illustrate in top plan view a second preferred embodiment of the present invention.
Figure 5:
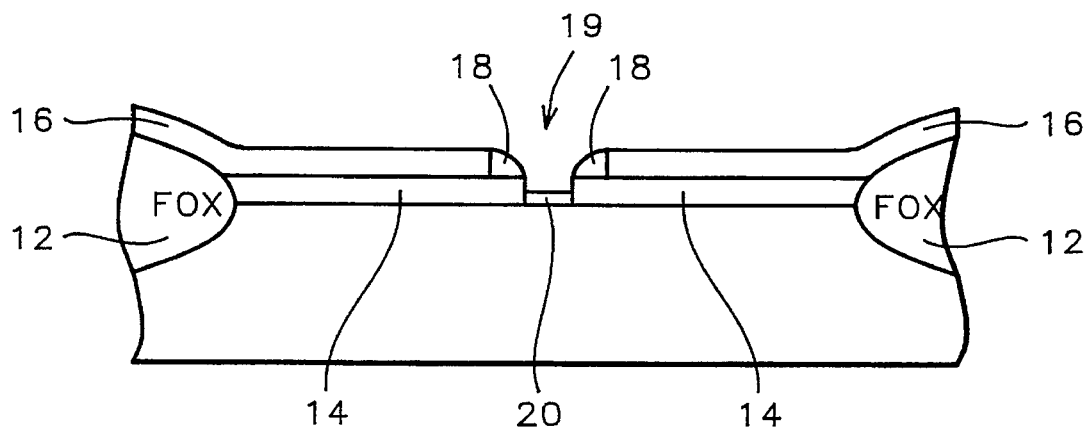
FIG. 5 schematically illustrates in cross-sectional representation a second preferred embodiment of the present invention.

Two preferred embodiments of the present invention are illustrated here. The top plan view of the NAND cell after the spacers has been formed and portions of the silicon dioxide have been removed in the first embodiment is shown in FIG. 3. Here, the tunneling window to be formed is a strip, with an elongated shape in which two opposing sides are relatively longer than the other two opposing sides. In the second embodiment, shown in top plan view in FIG. 4, a window with a shape having approximately equal sides rather than an elongated strip is to be formed. The coupling ratio in the second embodiment will be higher than in the first embodiment. The cross section in FIG. 2 is the same for both embodiments. View 5—5 of the second embodiment of FIG. 4 is illustrated in FIG. 5. The opening 19, having four approximately equal sides, is shown in FIG. 5. In the first embodiment, this cross-section would show an elongated strip rather than smaller opening 19.

Referring again to FIG. 2, the thin tunneling oxide 20 is grown on the exposed portions of the silicon substrate to a thickness of between about 60 to 100 Angstroms, and preferably about 90 Angstroms.

Figure 6:
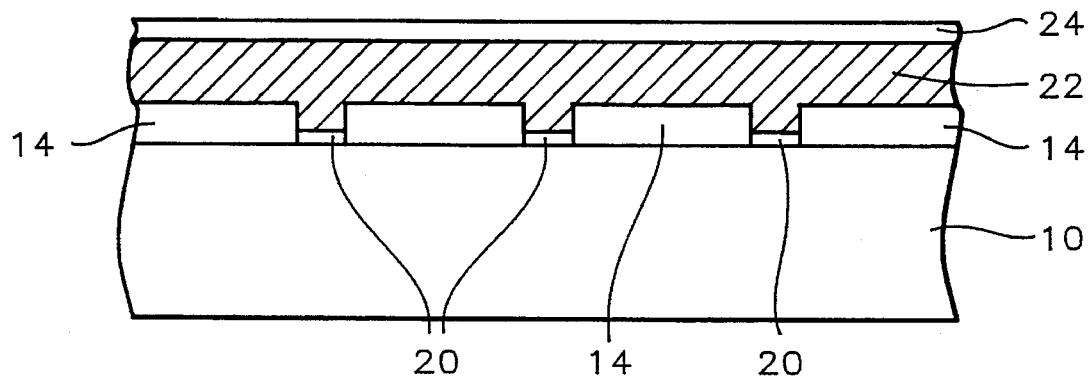

Referring now to FIG. 6, the silicon nitride layer 16 and spacers 18 are removed, typically by hot phosphoric acid. The thin tunneling oxide may be grown after the silicon nitride is removed, rather than before it is removed. In fact, it is best if the tunneling oxide is grown after removal of the silicon nitride.

Figure 7:
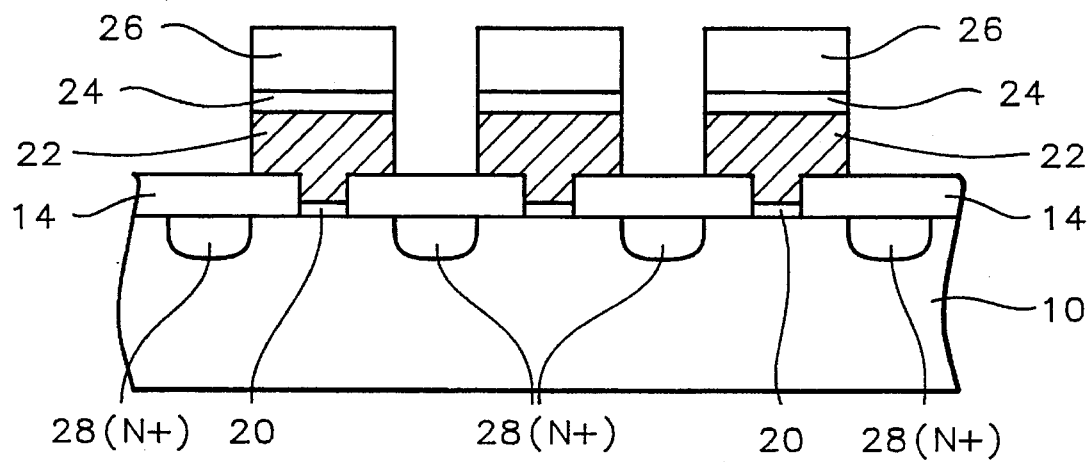

A layer of polysilicon 22 is deposited over the surface of the substrate to a thickness of between about 1000 to 3000 Angstroms and doped. An interpoly dielectric 24, such as ONO (silicon oxide-silicon nitride-silicon oxide) is deposited over the polysilicon layer 22. A second polysilicon layer 26 is deposited over the dielectric 24 to a thickness of between about 2000 to 5000 Angstroms and doped. The first and second polysilicon and ONO layers are etched to form the floating gates 22 and control gates 26 of the memory cell, as illustrated in FIG. 7. Alternatively, the control gate could be formed of a polycide layer.

Arsenic ions are implanted with a dosage of between about 2 E 15 to 8 E 15 atoms/cm$^2$ at a energy of between about 40 to 100 KeV to form N+ source and drain regions 28.

Figure 8:
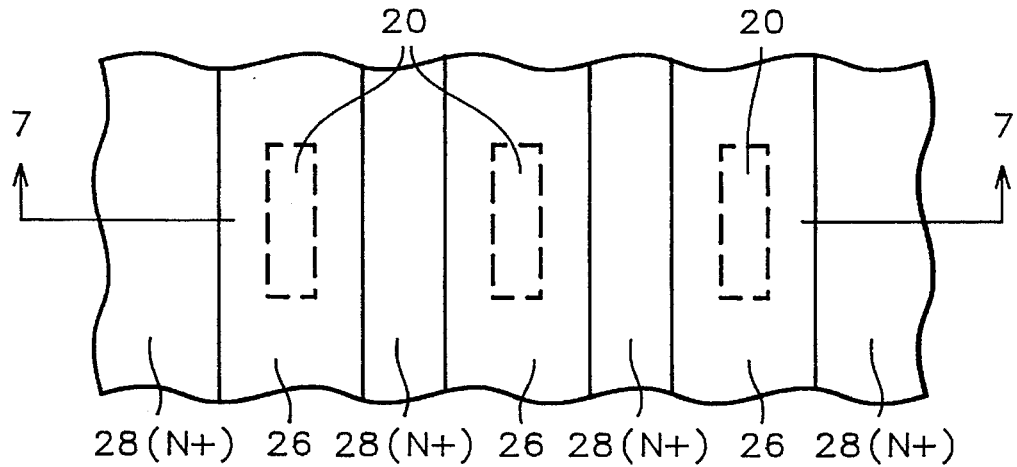
Figure 9:
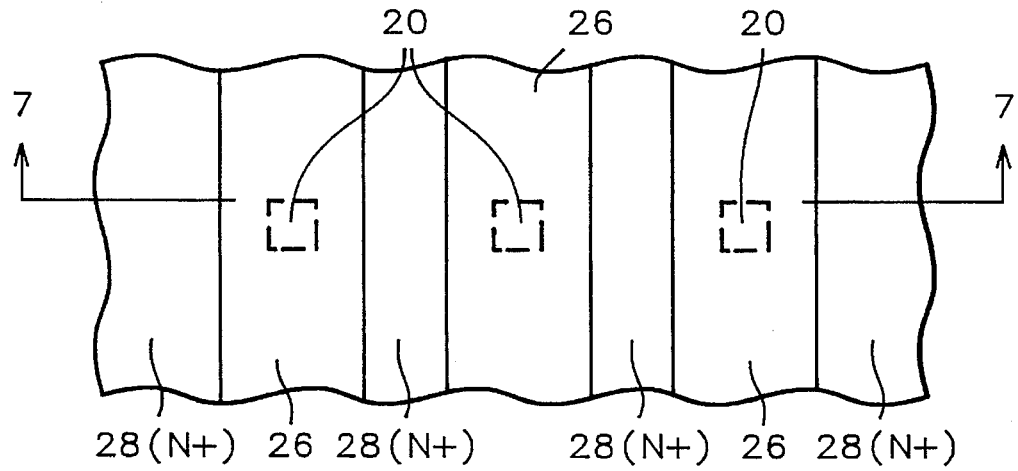

FIG. 8 illustrates a top plan view of FIG. 7 showing the elongated strip tunneling window 20 under the floating gate 22. This tunneling window could be, for example, about 0.15 by 0.6 microns in size. FIG. 9 illustrates a top plan view of FIG. 7 showing the tunneling window 20 under the floating gate 22, as in the second embodiment. This tunneling window may be, for example, about 0.15 by 0.15 microns in size, depending upon the active width of the memory cell. The coupling ratio of the second embodiment may be as much as four times as high as the coupling ratio of the first embodiment.

Figure 10:
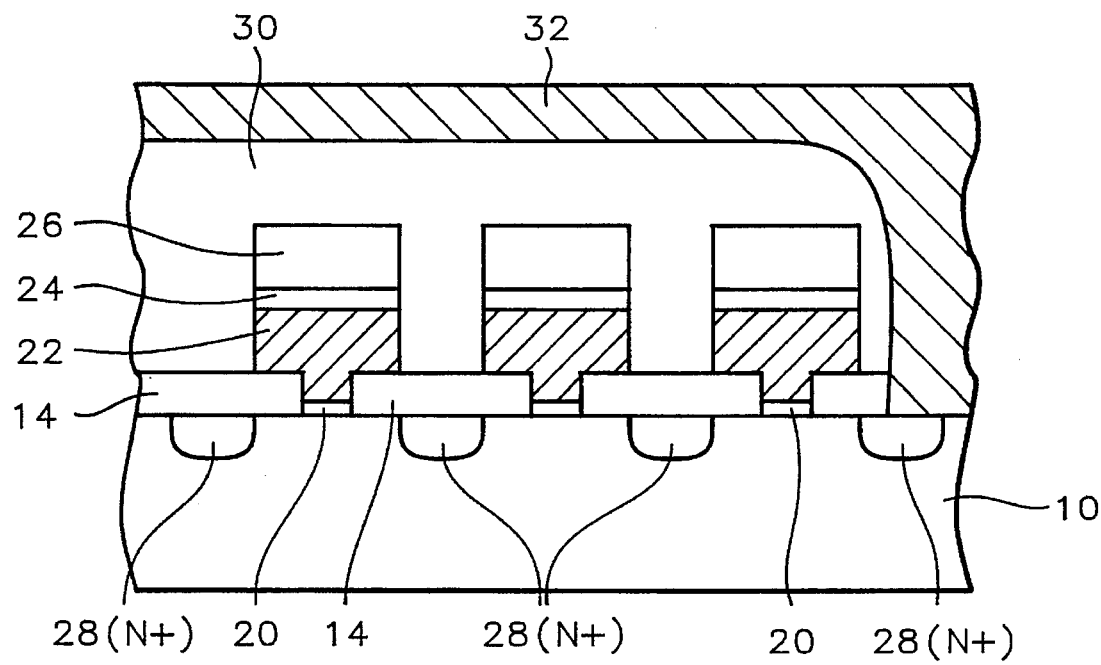

FIG. 10 illustrates a completed integrated circuit of the present invention in which passivation layer 30 has been blanket deposited over the gates. A contact opening has been made through the passivation layer 30 to the source/drain region 28. Metallization 32 completes the contact to N+ region 28.

Figure 11:
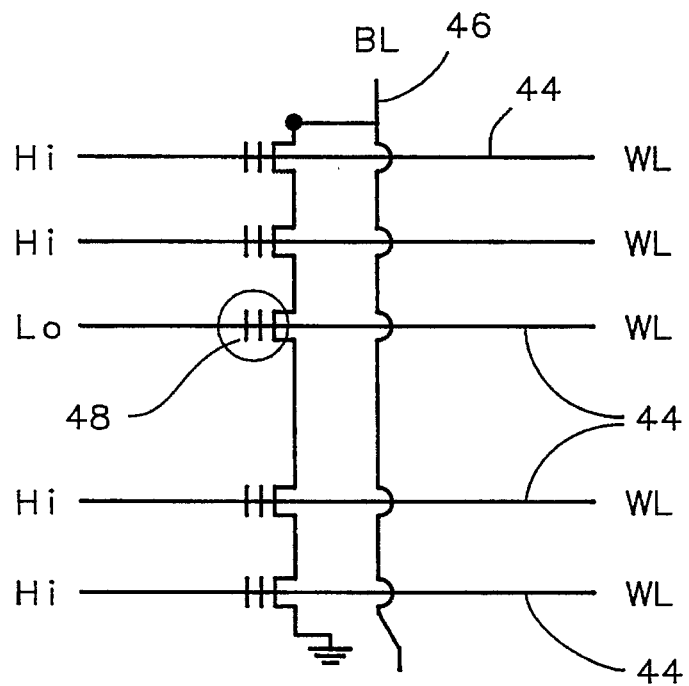
FIG. 11 illustrates a circuit diagram of a completed memory cell of the present invention.

FIG. 11 is a circuit diagram of the completed NAND-type Flash EEPROM memory cell, showing word lines 44 and bit line 46. Cell 48 is selected, or on.

The advantage of the present invention is an improved coupling ratio afforded by the small window for the tunneling oxide and thicker oxide used in other areas.

While the invention has been particularly shown and described with reference to the preferred embodiments thereof, it will be understood by those skilled in the art that various changes in form and details may be made without departing from the spirit and scope of the invention.

What is claimed is:

1. The method of forming a memory cell with improved coupling ratio comprising:

providing a layer of silicon dioxide over the surface of a semiconductor substrate;

depositing a layer of silicon nitride over said silicon dioxide layer and patterning said silicon nitride layer;

forming silicon nitride spacers on the sidewalls of said patterned silicon nitride layer whereby a portion of said silicon dixoide layer is covered with silicon nitride;

removing said silicon dioxide layer not covered by said patterned silicon nitride layer and said silicon nitride spacers wherein portions of said semiconductor substrate are exposed;

thereafter growing a tunnel oxide layer on said exposed portions of said semiconductor substrate;

removing said silicon nitride spacers and said silicon nitride layer;

depositing a first polysilicon layer over the surface of said silicon dioxide and said tunnel oxide layers and patterning said first polysilicon layer to form a floating gate;

depositing a dielectric layer over said patterned first polysilicon layer;

depositing a conductive layer overlying said dielectric layer and patterning said conducting layer to form a control gate; and providing passivation and metallization to complete the fabrication of said memory cell with improved coupling ratio.

2. The method of claim 1 wherein said silicon dioxide layer is grown to a thickness of between about 200 to 400 Angstroms.

3. The method of claim 1 wherein said silicon nitride layer has a thickness of between about 1000 to 2000 Angstroms.

4. The method of claim 1 wherein said silicon nitride spacers have a width of between about 500 to 3000 Angstroms.

5. The method of claim 1 wherein said exposed portions of said semiconductor substrate have an elongated shape wherein two opposing sides are longer than the other two opposing sides.

6. The method of claim 1 wherein said tunnel oxide is grown to a thickness of between about 60 to 100 Angstroms before said silicon nitride layer and spacers have been removed.

7. The method of claim 1 wherein said first polysilicon layer is deposited to a thickness of between about 1000 to 3000 Angstroms.

8. The method of claim 1 wherein said dielectric layer is composed of silicon oxide, silicon nitride, and silicon oxide layers.

9. The method of claim 1 wherein said conducting layer is composed of doped polysilicon deposited to a thickness of between about 2000 to 5000 Angstroms.

10. The method of claim 1 wherein said conducting layer is a polycide layer.

11. The method of forming a memory cell with improved coupling ratio comprising:

providing a layer of silicon dioxide over the surface of a semiconductor substrate;

depositing a layer of silicon nitride over said silicon dioxide layer and patterning said silicon nitride layer;

forming silicon nitride spacers on the sidewalls of said patterned silicon nitride layer whereby a portion of said silicon dioxide layer is covered with silicon nitride;

removing said silicon dioxide layer not covered by said patterned silicon nitride layer and said silicon nitride spacers wherein portions of said semiconductor substrate are exposed;

removing said silicon nitride spacers and said silicon nitride layer;

thereafter growing a tunnel oxide layer on said exposed portions of said semiconductor substrate to a thickness of between about 60 to 100 Angstroms;

depositing a first polysilicon layer over the surface of said silicon dioxide and said tunnel oxide layers and patterning said first polysilicon layer to form a floating gate;

depositing a dielectric layer over said patterned first polysilicon layer;

depositing a conducting layer overlying said dielectric layer and patterning said conducting layer to form a control gate; and providing passivation and metallization to complete the fabrication of said memory cell with improved coupling ratio.

12. The method of claim 11 wherein said silicon dioxide layer is grown to a thickness of between about 200 to 400 Angstroms.

13. The method of claim 11 wherein said exposed portions of said semiconductor substrate have a shape wherein there are four approximately equal sides.

14. The method of claim 11 wherein said exposed portions of said semiconductor substrate have an elongated shape wherein two opposing sides are longer than the other two opposing sides.

15. The method of forming a memory cell with improved coupling ratio comprising:

providing a layer of silicon dioxide over the surface of a semiconductor substrate;

depositing a layer of silicon nitride over said silicon dioxide layer and patterning said silicon nitride layer;

forming silicon nitride spacers on the sidewalls of said patterned silicon nitride layer whereby a portion of said silicon dioxide layer is covered with silicon nitride;

removing said silicon dioxide layer not covered by said patterned silicon nitride layer and said silicon nitride spacers wherein portions of said semiconductor substrate are exposed and wherein said exposed portions of said semiconductor substrate have a shape wherein there are four approximately equal sides;

thereafter growing a tunnel oxide layer on said exposed portions of said semiconductor substrate;

removing said silicon nitride spacers and said silicon nitride layer;

depositing a first polysilicon layer over the surface of said silicon dioxide and said tunnel oxide layers and patterning said first polysilicon layer to form a floating gate;

depositing a dielectric layer over said patterned first polysilicon layer;

depositing a conducting layer overlying said dielectric layer and patterning said conducting layer to form a control gate; and providing passivation and metallization to complete the fabrication of said memory cell with improved coupling ratio.

16. The method of claim 15 wherein said silicon dioxide layer is grown to a thickness of between about 200 to 400 Angstroms.

17. The method of claim 15 wherein said tunnel oxide is grown to a thickness of between about 60 to 100 Angstroms after said silicon nitride layer and spacers have been removed.

18. The method of claim 15 wherein said tunnel oxide is grown to a thickness of between about 60 to 100 Angstroms before said silicon nitride layer and spacers have been removed.

* * * * *